United States Patent
Glashauser et al.

(10) Patent No.: US 6,739,013 B2
(45) Date of Patent: May 25, 2004

(54) WAFER CLEANING APPARATUS

(75) Inventors: Walter Glashauser, Poughkeepsie, NY (US); Lutz Teichgräber, Moritzburg (DE)

(73) Assignee: Infineon Technologies SC300 GmbH & Co. KG, Dresden (DE)

( * ) Notice: Subject to any disclaimer, the term of this patent is extended or adjusted under 35 U.S.C. 154(b) by 209 days.

(21) Appl. No.: 09/950,437

(22) Filed: Sep. 10, 2001

(65) Prior Publication Data

US 2002/0088069 A1 Jul. 11, 2002

(30) Foreign Application Priority Data

Sep. 8, 2000 (EP) .............................. 00119660

(51) Int. Cl.⁷ ............................................... B08B 11/00
(52) U.S. Cl. .......................................... 15/102; 15/88.3
(58) Field of Search ................. 15/88.2, 88.3, 15/97.1, 102

(56) References Cited

U.S. PATENT DOCUMENTS

| 4,382,308 A | * | 5/1983 | Curcio ........................... 15/77 |
| 4,476,601 A | * | 10/1984 | Oka ........................... 15/88.3 |
| 6,033,522 A | | 3/2000 | Iwata et al. |
| 6,070,284 A | | 6/2000 | Garcia et al. |
| 6,079,073 A | | 6/2000 | Mackawa |
| 6,082,377 A | | 7/2000 | Frey |
| 6,464,796 B2 | * | 10/2002 | Vail et al. ....................... 134/6 |
| 6,544,343 B2 | * | 4/2003 | Ritchey et al. ................. 134/6 |
| 2002/0029431 A1 | * | 3/2002 | Oikawa et al. ................. 15/77 |
| 2002/0162181 A1 | * | 11/2002 | Krupa et al. ................... 15/77 |
| 2003/0000550 A1 | * | 1/2003 | Middendorf et al. ........... 134/6 |
| 2003/0111095 A1 | * | 6/2003 | Sugarman et al. ............. 134/6 |

FOREIGN PATENT DOCUMENTS

| DE | 199 04 548 A1 | 8/2000 |
| JP | 11-019609 | 1/1999 |
| JP | 11-195631 | 7/1999 |

* cited by examiner

*Primary Examiner*—Terrence R. Till
(74) *Attorney, Agent, or Firm*—Laurence A. Greenberg; Werner H. Stemer; Ralph E. Locher

(57) ABSTRACT

A wafer cleaning apparatus includes a wafer supporting device for supporting a wafer to be cleaned, and sponges for cleaning the wafer. The sponges are arranged in contact with either surface of the wafer and are rotated along rotational axes that are parallel to the wafer. A sponge positioning device pushes the sponges against the wafer. A wafer rotation drive is adapted to rotate the wafer at a constant speed, and a sponge rotation drive system is adapted to rotate the sponges at a constant speed. A closed loop controller receives motor current signals from the wafer rotation drive and/or the sponge rotation drive system, and the closed loop controller provides an adjustment signal to the sponge positioning device. The adjustment signal is for adjusting the friction between the sponges and the wafer.

9 Claims, 2 Drawing Sheets

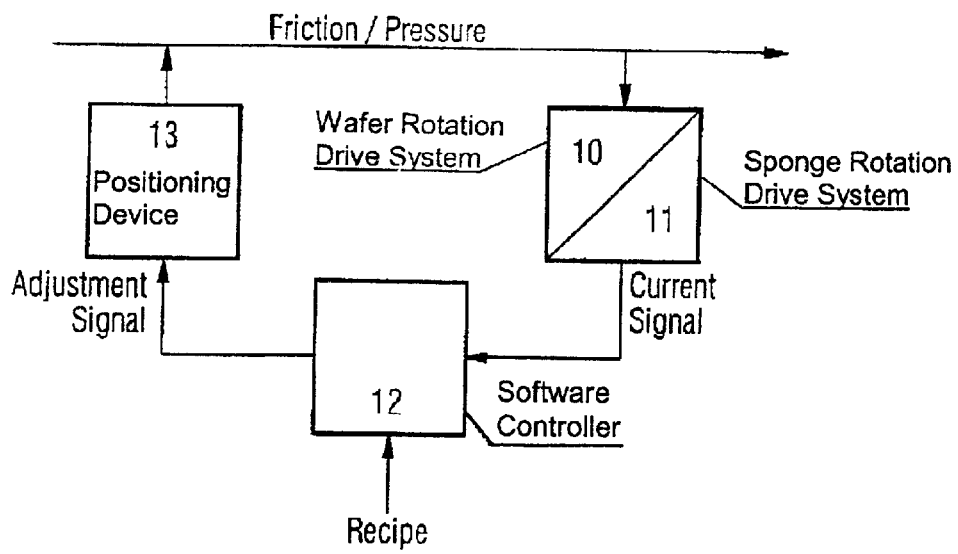
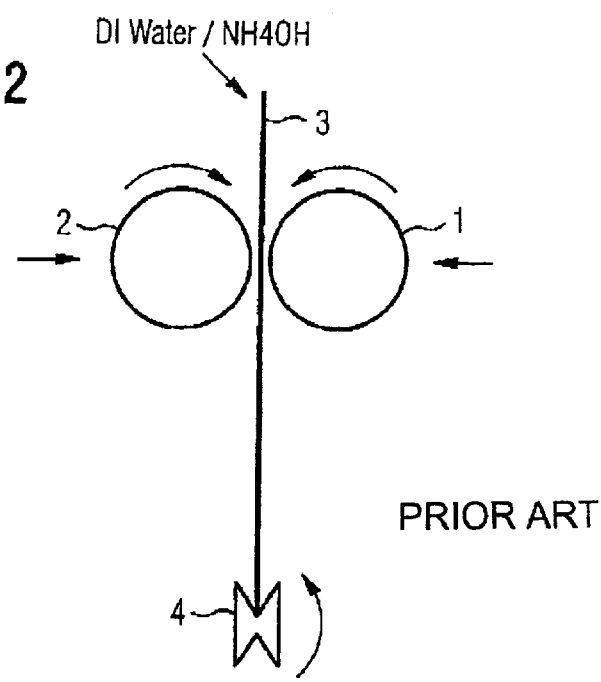
PRIOR ART

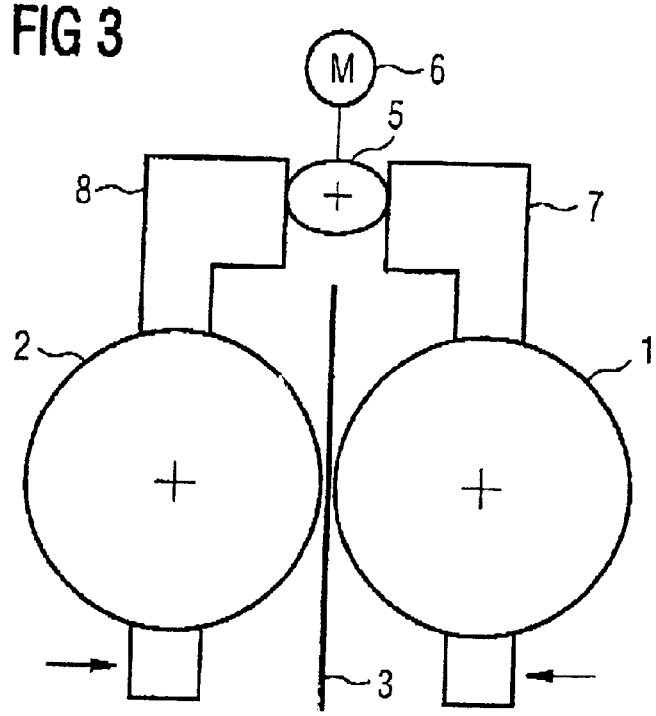
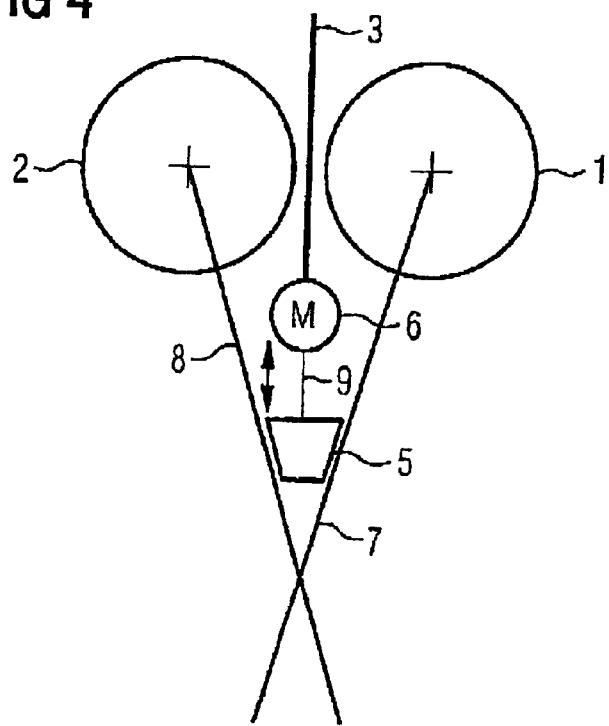

WAFER CLEANING APPARATUS

BACKGROUND OF THE INVENTION

Field of the Invention

The present invention relates to a wafer cleaning apparatus which can be suitably used for post CMP (Chemical Mechanical Polishing) cleaning.

Generally, after Chemical Mechanical Polishing of a wafer, a very efficient removal of particles from the wafer surface is required.

To this end, as is shown in FIG. 2, the wafer 3 is placed in a cleaner box in a vertical orientation and two cylindrical PVA (polyvinyl acrylate) sponges 1, 2 are brought into physical contact with either surface of the wafer 3. The cylinder axes of the sponges 1, 2 are parallel to the wafer 3, and the sponges 1, 2 are rotating in opposite directions. Accordingly, the wafer 3 is standing between rotating sponges 1, 2 pushing toward the wafer surface. Moreover, deionized water and/or chemicals are applied to the wafer 3 as well as to the sponges 1, 2 in order to remove particles from the wafer 3 and the sponges 1, 2.

In order to cover the whole wafer surface, the wafer 3 also has to be rotating during the cleaning process. For this purpose, the wafer 3 is supported by rollers 4 which make the wafer 3 rotate. The rollers 4 as well as the rotational axes of the sponges 1, 2 are driven by servo motors.

In order to obtain satisfactory cleaning results, constant pressure and friction conditions between the sponges 1, 2 and the wafer 3 regardless of changes of the mechanical characteristics of the sponges are required.

To satisfy this requirement, the pressure being applied in order to push the sponges 1, 2 towards the wafer 3 may be controlled by a pressure regulator.

Alternatively, the pressure conditions are determined by presetting a gap between both sponges 1, 2. To this end, the sponges 1, 2 are moved towards a hard stop system at a maximum pressure. The fixed dimensions cause an overlap between the outside circumference of the sponge 1 or 2 and the wafer 3. Thus, a certain pressure between sponges 1, 2 and the wafer 3 is generated.

However, the presetting of the gap is a very complicated process since the hard stop can only manually be adjusted. In particular, the width of the gap has to be adjusted at a very high precision and the wafer 3 must accurately be centered between the two sponges 1, 2.

In summary, the known methods of applying a constant pressure between the sponges and the wafer involve the following drawbacks:

There is no control of the real force and friction conditions between the sponges and the wafer. Usually, changes in the mechanical characteristics of the sponges or the removal of the top layer of the wafer lead to differences in the friction conditions between the sponges and the wafer. Hence, different cleaning results are achieved if there is not any control of the mechanical parameters of the cleaning process.

There is no possibility of adapting the real friction conditions to a changed process requirement. For instance, at some point of the cleaning process, special friction conditions might become useful for obtaining an optimum cleaning result.

In particular, when using the hardstop system, the cleaning conditions are preset as soon as new sponges are installed. However, in the course of time, the compression may reduce the outer diameter of the sponges. These changes will directly impact the pressure conditions, and thus, the cleaning results.

Accordingly, a lot of maintenance activities are required. In particular, the accuracy of the gap between the sponges must be frequently checked and reset.

Nevertheless, there is no control of the cleaning parameters over the lifetime of the sponges.

SUMMARY OF THE INVENTION

It is accordingly an object of the invention to provide a wafer cleaning apparatus which overcomes the above-mentioned disadvantageous of the prior art apparatus of this general type. In particular, it is an object of the invention to provide a wafer cleaning apparatus having a closed loop control for controlling the friction existing between wafer and sponges.

With the foregoing and other objects in view there is provided, in accordance with the invention, a wafer cleaning apparatus for cleaning a wafer having two surfaces. The wafer cleaning device includes a wafer supporting device for supporting the wafer to be cleaned, and sponges for cleaning the wafer. Each of the sponges is configured in contact with either one of the surfaces of the wafer. The sponges are rotatably mounted with rotational axes that are parallel to the wafer. The wafer cleaning device also includes a sponge positioning device for pushing the sponges against the wafer; a wafer rotation drive adapted to rotate the wafer at a constant speed; a sponge rotation drive system adapted to rotate the sponges at a constant speed; and a closed loop controller receiving motor current signals from a rotation drive selected from the group consisting of the wafer rotation drive and the sponge rotation drive system. The closed loop controller provides an adjustment signal to the sponge positioning device. The adjustment signal is for adjusting friction between the sponges and the wafer. The sponges are preferably cylindrical and the motor current signals represent friction data between the wafer and the sponges.

The motor current signals from the wafer rotation drive and/or sponge drive are used to online control the frictional conditions between the wafer and the sponges. These signals, which represent the torque necessary to maintain a constant driving speed, and thus, represent the real frictional conditions between the wafer and the sponges, are given to a closed loop control to actively and online correct changes of the cleaning conditions. Thus, changes in the mechanical characteristics of the sponges do not impact the cleaning process, and the frictional conditions can always be kept constant over the lifetime of the sponges.

The present invention can be implemented using different mechanisms for pushing the sponges against the wafer surfaces. For instance, the adjustment signal provided by the closed loop control can be given to a pressure regulator which sets the pressure applied to the sponges on the basis of the adjustment signal.

Alternatively, the adjustment signal provided by the closed loop control can be given to a positioning system that, preferably electrically, controls the position of the sponges.

In particular, this electric positioning system can include a hard stop system for setting the gap between the two sponges. In this case, the hard stop is specially designed and a motor drive for adjusting the position of the hard stop is provided. The position of the hard stop will determine the gap between the two sponges as will be explained later in more detail.

However, any arbitrary system for positioning the sponges in relation to the wafer can be used as well.

In summary, the present invention provides the following advantages:

It is possible to get information about the real frictional conditions between the sponges and the wafer during the wafer cleaning process. Thus, an online feedback signal about a very important cleaning parameter can be received and this signal can be used for closed loop control of the mechanical cleaning parameter.

Consequently, taking into account the closed loop control of the rotational speed of the sponges, which has normally been used in the state of the art, the mechanical part of the cleaning process is completely controlled.

The present invention enables an online correction, and thus, an immediate reaction if the friction conditions are changing.

Thus, the same frictional conditions can always be maintained whereby the stability of the process can be remarkably improved.

Moreover, an automatic adjustment of the process parameter representing the friction becomes possible. Thus, an adaptation to varying process requirements becomes possible, for example, with different products, different frictional conditions can be adjusted.

The present invention enables an online control of the sponge behavior over the whole lifetime of the sponge.

In addition, the lifetime of the sponges can be increased by applying different frictional conditions as soon as the sponges have reached their standard lifetime.

Moreover, according to a preferred embodiment of the present invention, the desired frictional conditions can be preset in a recipe or instruction set and can thus be adapted to different cleaning requirements.

If additionally the positioning device includes a hard stop system, the following additional advantages are achieved:

A closed loop pressure control system is not necessary.

Moreover, the hard stop position can be additionally monitored.

In addition, the step of presetting the gap, which is a complicated process, can be avoided.

Hence, the maintenance activities can considerably be reduced. In particular, frequent checks of the adjustment of the gap between the sponges are no longer necessary.

In summary, the implementation of the present invention will increase the yield, improve the wafer cycle time, and consequently, reduce the cost.

Other features which are considered as characteristic for the invention are set forth in the appended claims.

Although the invention is illustrated and described herein as embodied in Wafer Cleaning Apparatus, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1 is a block diagram illustrating closed loop control of a wafer cleaning apparatus;

FIG. 2 illustrates the post CMP cleaning process to which the present invention usually is applied;

FIG. 3 illustrates a possible implementation of the hardstop system used in the wafer cleaning apparatus; and FIG. 4 illustrates a further possible implementation of the hardstop system used in the wafer cleaning apparatus.

DESCRIPTION OF THE PREFERRED EMBODIMENTS

Referring now to the figures of the drawing in detail and first, particularly, to FIG. 1 thereof, there is shown a software controller 12 which receives a current signal from the wafer rotation drive 10 and/or the sponge rotation drive system 11. The current signal supplied by the wafer rotation drive 10 or the sponge rotation drive system 11 represents the torque necessary to maintain the wafer rotation or the sponge rotation at a constant speed, and thus, directly represents the real frictional conditions between the sponge and the wafer. Usually, the wafer and the sponges are driven by servo drives which provide analog output signals that are proportional to the motor current.

In the described embodiment of the present invention, the number of sponges used is two, and the sponge rotation drive system 11 includes one single servo drive for rotating both sponges. Accordingly, since the frictional conditions of the two wafer surfaces, to which the sponges are pushed, normally differ, an average value of the real frictional conditions of the two wafer surfaces is measured.

However, any arbitrary even number of sponges can be used, and the sponge rotation drive system 11 can include more than one servo drive, for example, one servo drive for the sponges on each wafer surface.

The software controller 12 compares the friction data represented by these current signals with preset friction conditions. Among others, these preset friction conditions take into account that the measured friction data are an average value as mentioned above.

According to a preferred embodiment of the present invention, a recipe or an instruction set representing the friction conditions which are adapted to different cleaning requirements, in particular, for different layers, can be stored in a storage means which is included in the software controller 12.

The software controller provides a correction signal to a positioning device 13 for pushing the sponges against the wafer. The positioning device 13 controls the pressure between the sponges and the wafer on the basis of this correction signal so that finally, a preset value of friction between the sponges and the wafer is achieved. This can be accomplished by either adjusting the position of the sponges or by adjusting the pressure at which the sponges are pushed against the wafer surface.

In more detail, if the motor current is lower than the preset value, the sponges will be moved further toward the wafer or the pressure of the sponges will be enhanced. On the other hand, if the motor current is higher than the preset value, the sponges will be moved away from the wafer or the pressure of the sponges will be reduced.

FIGS. 3 and 4 illustrate embodiments of the present invention in which the positioning device is implemented as a device for setting the position of the sponges that includes a hardstop 5 and a motor drive 6.

In these embodiments, as is shown in FIGS. 3 and 4, the two sponges 1, 2 are held by shafts 7, 8. When the cleaning process is started, the shaft system keeping the sponges 1, 2 in position is moved pneumatically towards the hardstops 5 at a maximum pressure. Accordingly, the sponges 1, 2 are pushed towards the wafer 3 and the pressure between the sponges 1, 2 and the wafer 3 is set by setting the gap which is determined by the hardstop position.

If this hard stop system is used the pressure applied between the wafer 3 and the sponges 1, 2 can easily be adjusted and no complicated closed loop pressure control system is necessary.

As is illustrated in FIG. 3, the hardstop 5 can be implemented as an elliptical cam plate, and the two shafts 7, 8 are arranged in parallel. In this case, the rotational angle of the cam plate and, thus, the distance between the two shafts 7, 8 and, consequently, the gap between the two sponges 1, 2 is adjusted by the motor drive 6. Hence, the minimum distance between the two shafts 7, 8 is equal to the minor axis of the ellipse, and the maximum distance between the two shafts 7, 8 is equal to the major axis of the ellipse.

Alternatively, as is depicted in FIG. 4, the hardstop 5 can be implemented as a truncated cone, with the two shafts 7, 8 arranged in a crossing manner. Each of the shafts 7, 8 is in contact with the envelope of the cone. In this case, the position of the hardstop 5, and thus, the crossing angle of the two shafts 7, 8, and consequently, the gap between the two sponges 1, 2 is adjusted by a spindle 9 which is driven by the motor drive 6.

According to the present invention, as an alternative to the hard stop system, the positioning system can also be implemented as a set of spindles, each physically connecting the sponges and a set of cantilevers for supporting the sponges. The cantilevers are held in parallel at a constant distance. By adjusting these spindles, the position of the sponges can appropriately be set. This implementation involves the advantage that each of the sponges can separately be adjusted. Moreover, in contrast to the implementation using the hard stop system, it is not necessary to center the wafer between the two sponges.

We claim:

1. A wafer cleaning apparatus for cleaning a wafer having two surfaces, comprising:
    a wafer supporting device for supporting the wafer to be cleaned;
    sponges for cleaning the wafer, each of said sponges configured in contact with either one of the surfaces of the wafer, said sponges rotatably mounted with rotational axes that are parallel to the wafer;
    a sponge positioning device for pushing said sponges against the water;
    a wafer rotation drive adapted to rotate the wafer at a constant speed;
    a sponge rotation drive system adapted to rotate said sponges at a constant speed; and
    a closed loop controller receiving respective motor current signals from said wafer rotation drive and said sponge rotation drive system;
    said closed loop controller providing an adjustment signal to said sponge positioning device, maid adjustment signal for adjusting friction between said sponges and the wafer in response to the motor current signals.

2. The wafer cleaning apparatus according to claim 1, wherein said sponge positioning device includes a device for setting a position of said sponges.

3. The wafer cleaning apparatus according to claim 2, wherein said device for setting the position of said sponges includes a hardstop and a motor drive.

4. The wafer cleaning apparatus according to claim 3, wherein said hardstop is an elliptical cam plate, said elliptical cam plate mounted at a rotational angle that is adjusted by said motor drive.

5. The wafer cleaning apparatus according to claim 3, comprising:
    two crossing shafts holding said sponges; and
    a spindle that sets a position of said hardstop;
    said hardstop is formed as a truncated cone.

6. The wafer cleaning apparatus according to claim 1, wherein said sponge positioning device includes a pressure regulator for controlling a pressure at which said sponges are pushed against the wafer.

7. The wafer cleaning apparatus according to claim 1, wherein said closed loop controller includes storage means for storing a recipe representing frictional conditions that are adapted to different cleaning requirements.

8. The wafer cleaning apparatus according to claim 1, wherein said closed loop controller includes storage means for storing instructions representing frictional conditions that are adapted to different cleaning requirements.

9. The wafer cleaning apparatus according to claim 1, wherein said closed loop controller includes a storage device for storing instructions representing frictional conditions that are adapted to different cleaning requirements.

* * * * *